United States Patent
Tedrow

Patent Number: 6,075,751
Date of Patent: Jun. 13, 2000

[54] SIGNAL TRANSITION DETECTOR FOR ASYNCHRONOUS CIRCUITS

[75] Inventor: Kerry Tedrow, Folsom, Calif.

[73] Assignee: Intel Corporation, Santa Clara, Calif.

[21] Appl. No.: 09/231,725

[22] Filed: Jan. 15, 1999

[51] Int. Cl.[7] .................................................. G11C 8/00
[52] U.S. Cl. ........................ 365/233.5; 365/194; 327/31; 327/36
[58] Field of Search ................................ 365/233.5, 233, 365/191, 194, 195; 327/164, 165, 171, 172, 31, 36

[56] References Cited

U.S. PATENT DOCUMENTS

| | | | |
|---|---|---|---|
| 4,272,832 | 6/1981 | Ito | 365/233.5 |
| 4,872,143 | 10/1989 | Sumi | 365/233.5 |
| 5,243,575 | 9/1993 | Sambandan et al. | 365/233.5 |
| 5,295,117 | 3/1994 | Okada | 365/233.5 |
| 5,566,129 | 10/1996 | Nakashima et al. | 365/233.5 |
| 5,636,177 | 6/1997 | Fu | 365/233.5 |
| 5,805,517 | 9/1998 | Pon | 365/233.5 |

*Primary Examiner*—Tan T. Nguyen
*Attorney, Agent, or Firm*—Blakely, Sokoloff, Taylor & Zafman, LLP

[57] ABSTRACT

An apparatus for synchronizing a plurality of signals entering an electronic device. In one embodiment, the apparatus comprises a filter to receive a signal of the plurality of signals entering the electronic device, wherein if a pulse width of the signal exceeds a first predetermined width, the filter outputs a pulse of a second predetermined width. The apparatus further comprises a pulse generator coupled to receive the pulse of the second predetermined width, and in response, to transmit a signal to elements of the electronic device to indicate a change of state of the signal.

14 Claims, 11 Drawing Sheets

SIGNAL TRANSITION DETECTOR FOR ASYNCHRONOUS CIRCUITS

FIELD OF THE INVENTION

The present invention is in the field of synchronizer circuits for synchronizing signals entering an asynchronous integrated circuit (IC) device. More particularly, the present invention is in the field of address signal transition detectors.

BACKGROUND OF THE INVENTION

Complex electronic systems usually include multiple circuits or subcircuits. Several circuits or subcircuits may reside on one IC or on different ICs. A circuit may operate with a clock signal to synchronize signals entering and leaving the circuit. Such a circuit is known as a synchronous circuit. Circuits that do not have a clock signal for controlling signals entering and leaving the circuit are known as asynchronous circuits. Different synchronous circuits may have differing timing requirements. Problems or errors in system operations can occur when signals are transmitted between circuits that have different timing requirements. Therefore, various circuits and methods exist to synchronize signals transmitted between circuits in a system.

An example of an asynchronous circuit is a nonvolatile memory device, such as a flash memory device. An asynchronous nonvolatile memory that is a discrete integrated circuit is accessed at random by other circuits that require data stored at particular addresses of the memory device. Nonvolatile memory devices are accessed by a variety of signals, including a mutli-bit address signal. In some memory devices, it is worthwhile to detect a transition on the incoming address lines so that the memory device can be prepared for an upcoming access. In various circumstances, the ability to detect an access makes the memory device more efficient. For example, detecting a transition on an address line indicates that a memory access has begun, allowing a device can to also determine when the memory access has completed and power down word lines accordingly.

Memory devices that detect address signal transitions typically include some circuitry that produces an address transition detection (ATD) signal. The ATD signal can be used for, among other things, preparing sensing circuits. For example, nodes that are known to be slow to slew can be precharged to some equilibrium point, that is, to a voltage midway between the voltage representing logic one and the voltage representing logic zero. Preparation of sensing circuits decreases access time. An ATD signal can also be used to initiate bit line charging and word line boosting. Bit line charging and word line boosting are known in the art.

For memory devices with certain semiconductor architectures, ATD signals are particularly useful to initiate word line powerdown. As is known, in memory devices with a single-well semiconductor architecture, it is necessary to place a positive voltage of, for example, five volts on a word line at the same time as a negative voltage of five volts on the gate of a blocking transistor, such that a ten volt oxide stress results. If a ten volt oxide stress is maintained, the device will break down. It is known, however, that read operations occur only intermittently and that a single word line is only used in some read operations. It is possible, to greatly reduce the amount of time that the oxide realizes a ten volt stress by powering down the word line to zero volts when it is not being used for a read operation. An ATD signal allows this to be done because the ATD signal indicates when a read operation is completed.

Circuits currently exist for detecting address transitions in memory devices, but they posses some inadequacies that cause improper memory operations under some circumstances. FIG. 1 is a block diagram of prior art address transition detection circuitry. Address signals A0–AN enter the ATD circuitry from address pads. Integrated circuit 141 is a nonvolatile memory. Address pads 132 and 134 are shown. Address pad 132 carries an external address signal 106, which is labeled A0. Address pad 134 carries external address signal 108, which is labeled AN. A complete address may include various numbers of bits. Address signals between signal 106 and 108 are not shown in FIG. 1. Each address signal entering an integrated circuit 141 passes through an input buffer such as buffer 102. The output of buffer 102 is internal address signal 104. Internal address signal 104 is transmitted along address path 151 to be used for addressing the memory device in a conventional way. Parallel to address path 151 is an address transition detection path that begins with internal address 104, which is an input to XOR gate 118. Internal address signal 104 is also an input to delay circuit 114. XOR gate 118 compares internal address signal 104 with the delayed version of itself (signal 116) and outputs an active address transition detection (ATD) signal only when internal address signal 104 and delayed internal address signal 116 have different logic states. ATD signal 140 thus signals a transition of address bit zero.

Address bit N and all intervening address bits between address bit zero and address bit N are treated similarly. External address signal 108 is input to buffer 110 to produce internal address signal 112. Internal address signal 112 is transmitted along address path 153 and also to delay circuit 128. The output of delay circuit 128 is input as delayed address signal 130 to XOR gate 126. XOR gate 126 also receives internal address signal 112 and outputs ATD signal 142 associated with address bit N. All ATD signals, one for each address bit input to integrated circuit 141, are input to OR gate 120. Therefore, when any of the ATD signals 0–N are active, ATD signal 144 will go active. An active ATD signal 144 activates master pulse generator 122 which outputs master pulse 124. Master pulse 124 is used to activate circuitry that prepares the memory for an access as previously described. When the device generating address bits A0–AN produces glitches on any one of the address lines, the circuit of FIG. 1 may cause improper operation of master pulse generator 122, and consequently, access errors in memory device 141. A glitch is a transition (low to high or high to low) of an input signal that crosses the trip point of the circuit receiving it, followed a short time later by a transition in the opposite direction that recrosses the trip point of the circuit.

FIG. 2 is a timing diagram showing proper operation of the circuit of FIG. 1 when an incoming address signal is glitchless. FIG. 2 shows voltage as a function of time for address signal 202, which is an internal address signal such as address signal 104. ATD signal 204 is a signal such as ATD signal 140. OR output 206 is the output of an OR gate such as signal 144. Master pulse 208 is the output of a master pulse generator such as master pulse generator 122. Data out 210 is the output of a memory device such as memory device 141. Address signal 202 is shown transitioning, where the transition of address signal 202 causes a pulse on ATD signal 204. The high going edge of ATD signal 204 causes a pulse on OR output 206, which in turn causes a master pulse 208 to be generated. The high going edge of master pulse 208 initiates sense amplifiers of the memory device. The result of a sensing operation by the sense amplifiers is latched by the low going edge of master pulse 208. In proper operation, the sense amplifiers have completed sensing and, therefore, valid data is latched by master pulse 210.

FIG. 3 is a timing diagram showing improper operation of a circuit such as that shown in FIG. 1. Similarly named signals have similar descriptions like those of their counterparts in FIG. 2. Here a pulse is generated in ATD signal 214 by a transition on address signal 212. The high going edge of ATD signal 214 causes a pulse on OR output 216, which in turn causes master pulse 218 to be generated as in FIG. 2. In FIG. 3, however, glitch 222 occurs in address signal 212. Glitch 222 propagates as shown in ATD signal 214 in OR output 216. Glitch 222 eventually causes generation of a second master pulse 218a. Because of the relationship between input pulse width to output pulse width for master pulse generator 122, master pulse 218a is too short, causing invalid data to be latched on the falling edge of master pulse 218a. Thus, the prior art address transition in detector circuit provides independent address paths and address transition detection paths and fails to account for potentially error-causing glitches on incoming address signals.

SUMMARY OF THE INVENTION

An apparatus for synchronizing a plurality of signals entering an electronic device is described. In one embodiment, the apparatus comprises a filter to receive a signal of the plurality of signals entering the electronic device, wherein if a pulse width of the signal exceeds a first predetermined width, the filter outputs a pulse of a second predetermined width. The apparatus further comprises a pulse generator coupled to receive the pulse of the second predetermined width, and in response, to transmit a signal to elements of the electronic device to indicate a change of state of the signal.

DETAILED DESCRIPTION

A method and apparatus for synchronizing signals entering an integrated circuit device is described. One embodiment includes an address transition detector (ATD) circuit appropriate for use in a nonvolatile memory device. The ATD circuit receives an address signal representing one bit of an address that is used to address a memory array. The address signal is processed by a filter such that a detection pulse is generated only for internal address signals of a minimum width. A pulse generator generates an ATD signal for transmission to a master pulse generator wherein the ATD signal has a pulse width great enough to guarantee a full size master pulse.

Figure 1:
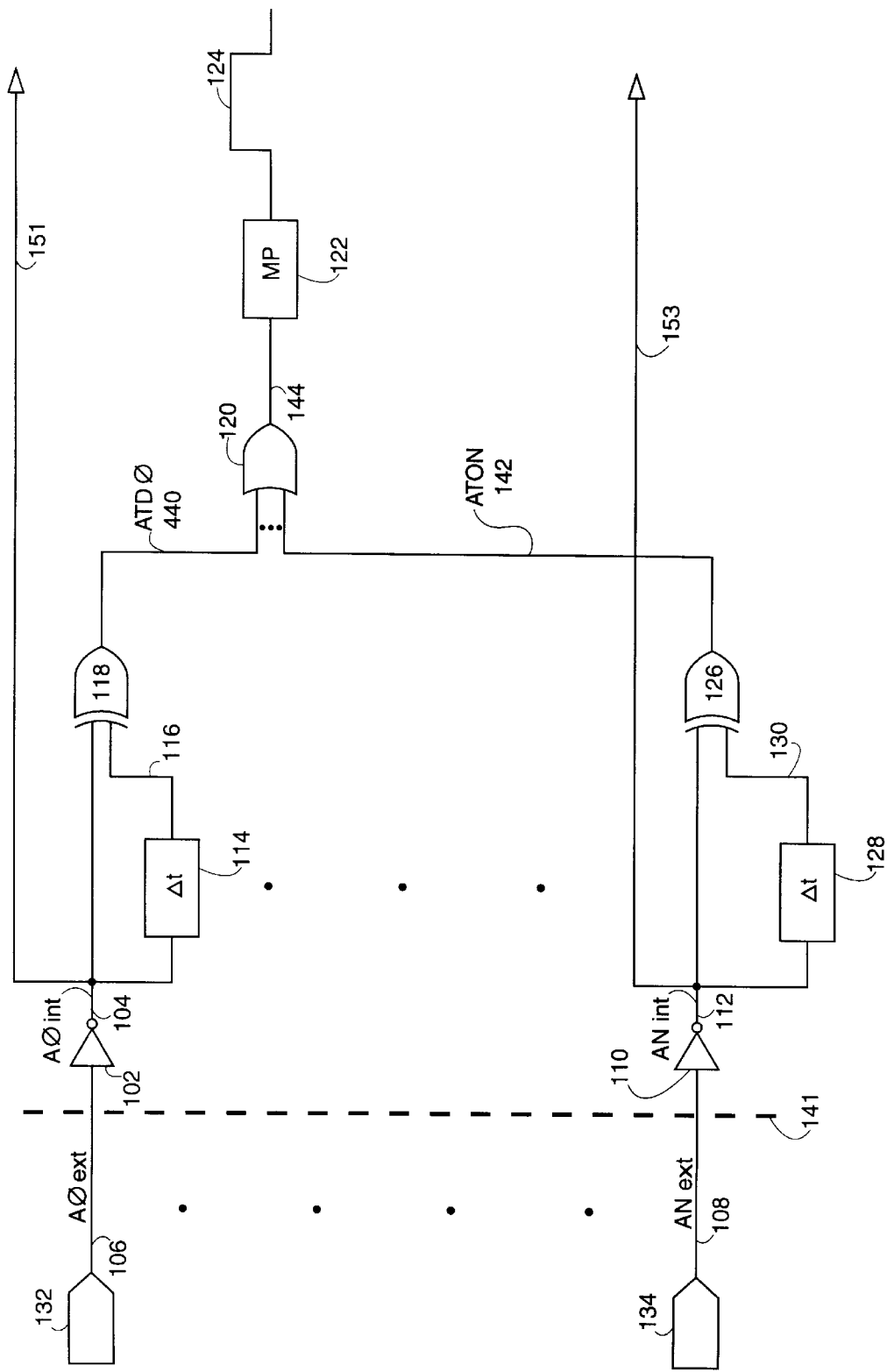
FIG. 1 is a block diagram of a prior art address transition detection (ATD) circuit.
Figure 2:
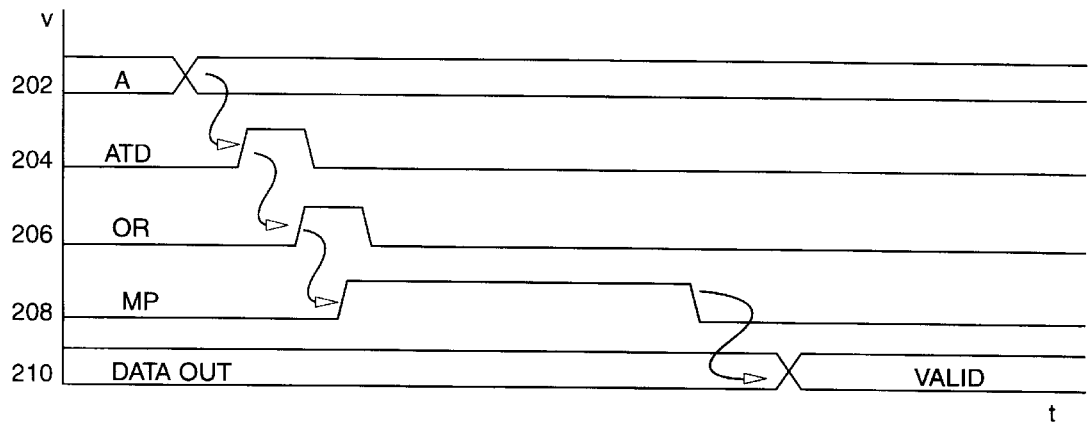
FIG. 2 is a timing diagram proper operation of the circuit of FIG. 1.
Figure 3:
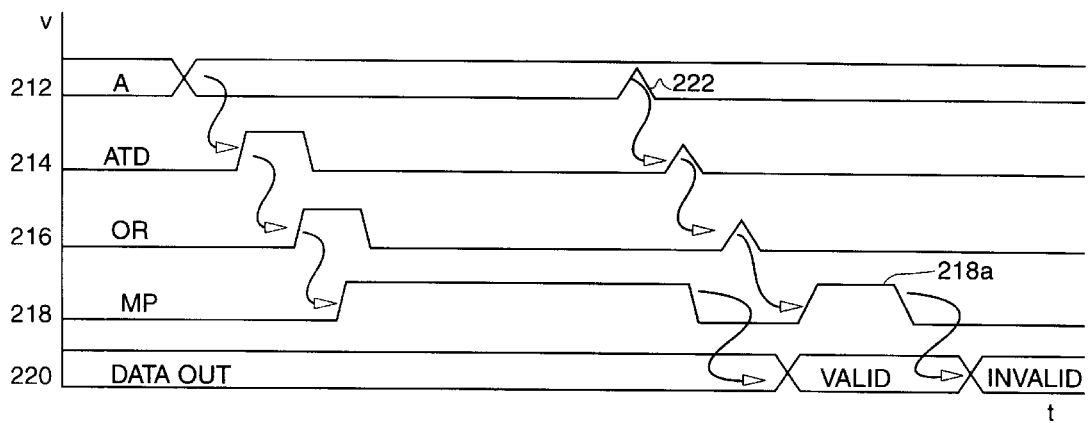
FIG. 3 is a timing diagram showing malfunction of the circuit of FIG. 1 due to an input signal glitch.
Figure 4:
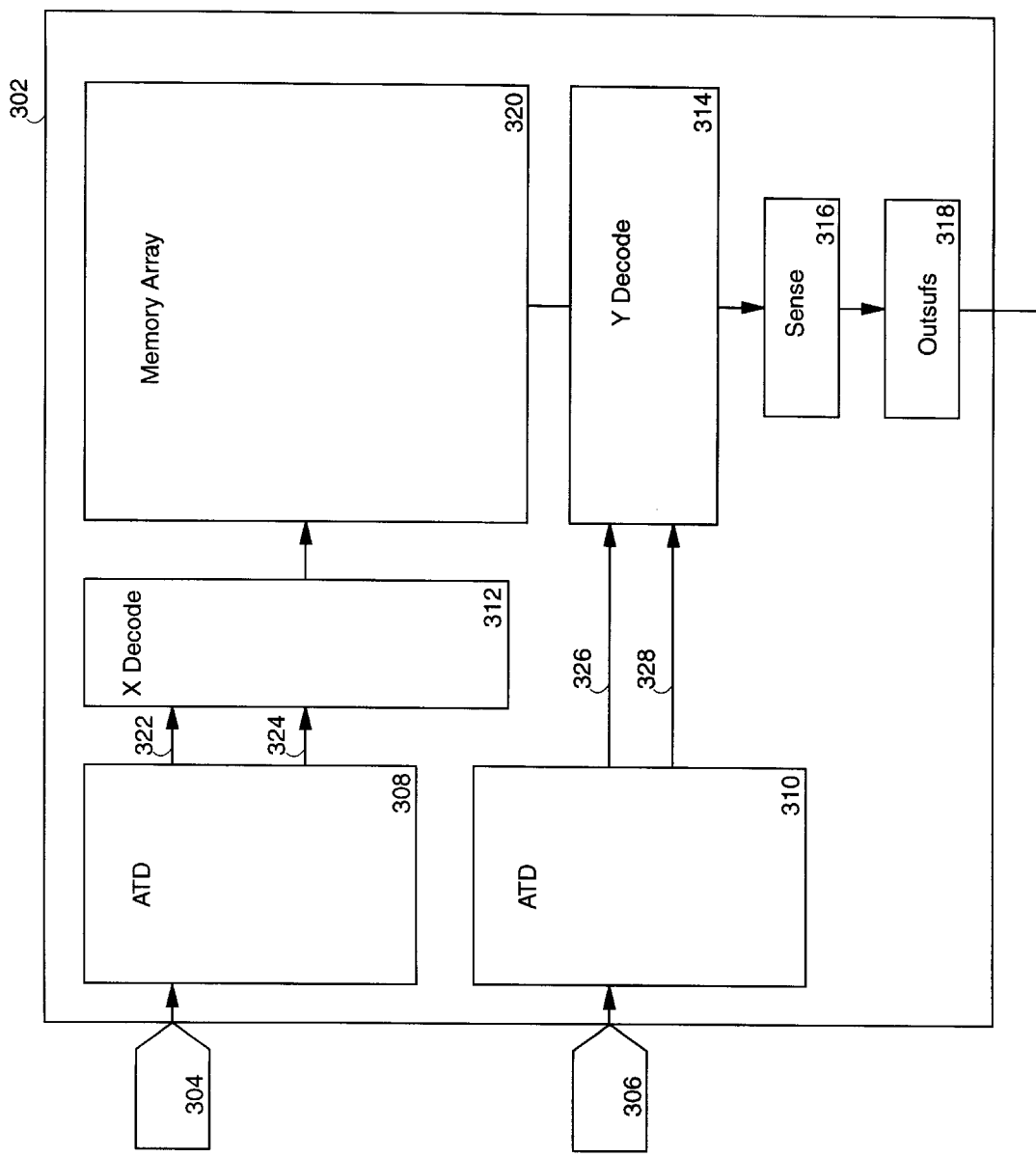
FIG. 4 is a block diagram of an integrated circuit with an ATD circuit.

FIG. 4 is a block diagram of a nonvolatile memory integrated circuit 302 according to one embodiment. Nonvolatile memory 302 includes memory array 320, X decoder 312, and Y decoder 314. As is known, X decoder 312 and Y decoder 314 receive address bits from outside memory 302 and use the address bits to locate particular information in memory array 320 that is sought by the device transmitting an address. Sense amplifiers 316 sense the information addressed in memory array 320 in a known manner and output the information through output buffers 318.

Address pads 304 carry external address signals to ATD circuit 308. ATD circuit 308 is one embodiment of an ATD circuit that produces an internal address signal 322 and ATD signal 324 for transmission to X decoder 312. An external address signal is transmitted on an address pad 304 for each of the multiple address signals transmitted to memory array 320. Similarly, for each address signal transmitted to memory array 320, address pads 306 carry external address signals to ATD circuit 310. ATD circuit 310 produces an internal address signal 326 and ATD signal 328 for transmission to Y decoder 314.

In one embodiment, a portion of an external address is applied to X decoder 312 and the remaining portion of the external address is applied to Y decoder 314. For example, for a 64 Mbit device, 23 address bits are required to access eight Mbytes of memory. Eleven address bits are then applied to X decoder 308 and twelve address bits are applied to Y decoder 314.

As explained more fully below, ATD circuits 308 and 310 synchronize internal address signals to ATD signals. In other words, the ATD circuits guarantee that an ATD pulse is generated for every internal address signal transition.

Figure 5:
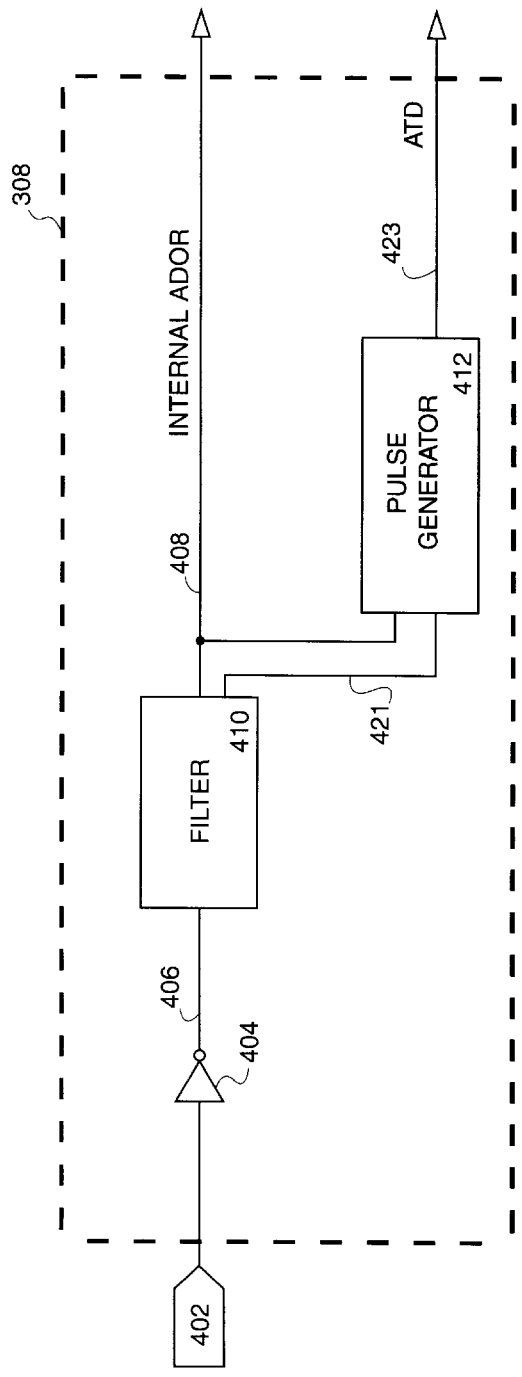
FIG. 5 is a block diagram of an embodiment of an ATD circuit

FIG. 5 is a block diagram of one embodiment of ATD circuit 308. ATD circuit 310 is identical to ATD circuit 308. The circuitry of ATD circuit 308 that is shown in FIG. 5 processes one address signal representing the state of one address bit. ATD circuit 308 includes similar circuitry for each address bit transmitted to memory 302. Address pad 402 transmits an address signal to input buffer 404. Input buffer 404 outputs external address signal 406 to filter 410. Filter 410 outputs internal address 408 and delayed internal address 421. Internal address 408 is transmitted to memory array 320 through X decoder 312. Internal address 408 is also input to pulse generator 412. Delayed internal address 421 is also input to pulse generator 412. Pulse generator 412 generates ATD signal 423 which indicates an address transition by transmitting a pulse of minimum width. In one embodiment, ATD signal 423, with ATD signals for each address bit, is input to an OR gate that outputs a signal to a master pulse generator. Because a minimum width ATD pulse is guaranteed by the circuit of FIG. 5, the master pulse generator does not generate short pulses that may cause memory malfunction.

Figure 6:
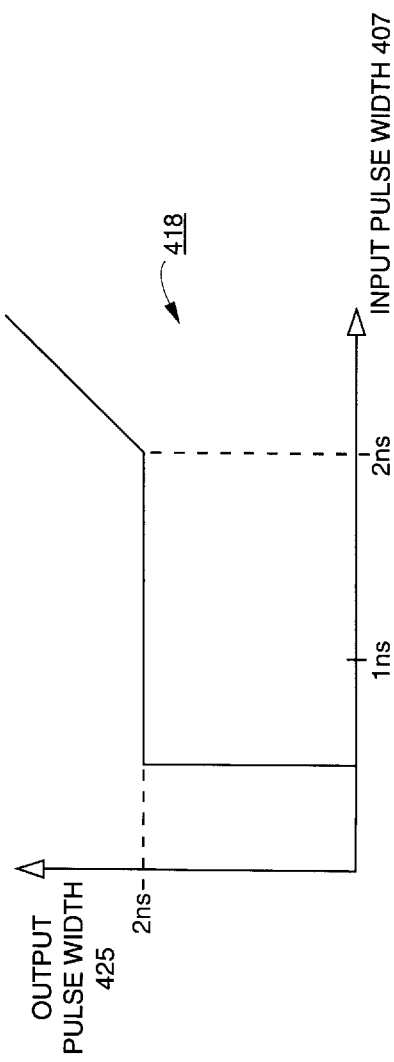
FIG. 6 is a diagram showing a transfer function of one embodiment.

FIG. 6 is a diagram showing output pulse width as a function of input pulse width for ATD 308. Output pulse width 425 corresponds to the width of a pulse on ATD signal 423. Input pulse width 407 corresponds to the width of a pulse on external address signal 406. Incoming external address signal pulse widths that are less than approximately one half nanosecond are not recognized. For an input pulse width of between one half nanosecond and two nanoseconds, the output pulse of width is two nanoseconds. For input pulse widths of over two nanoseconds, the output pulse width is greater than two nanoseconds.

As shown, function 418 is an ideal step function. Therefore, internal address 408 does not reflect glitches of under one half nanosecond in width on the external address signal, but for an input pulse width of over one half nanosecond, the output pulse width reliably increases to a minimum ATD pulse width. The master pulse generator receiving ATD signal 423 is thus assured to operate properly. ATD circuit 308 thus synchronizes internal address 408 to ATD signal 423 and alleviates the problem of malfunctions of memory array 320 due to address glitches.

Figure 7:
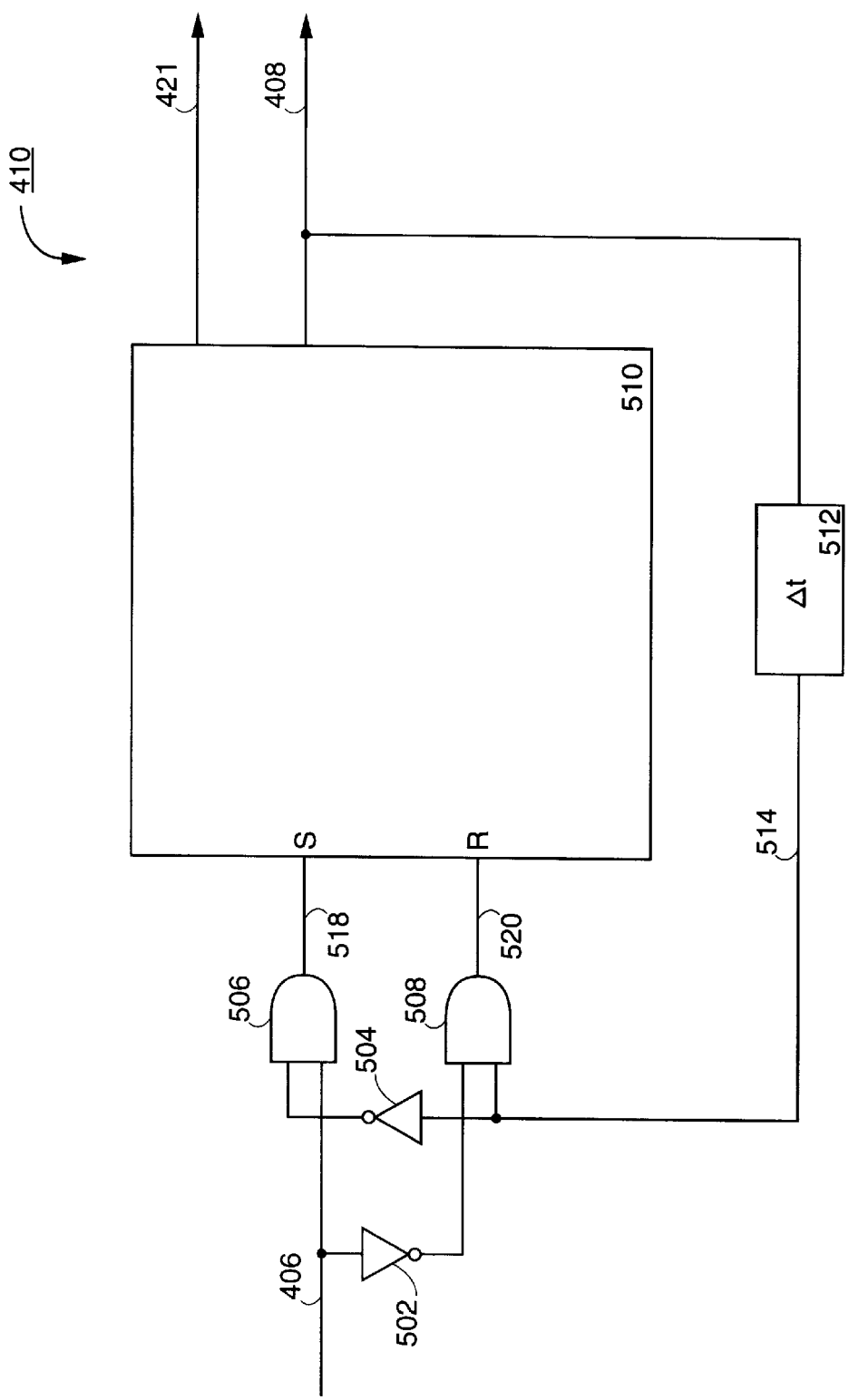
FIG. 7 is a block diagram of an embodiment of a filter.

FIG. 7 is a block diagram of filter 410 according to one embodiment. Filter 410 includes latch circuit 510 and conditioning circuitry. The conditioning circuitry includes AND gate 506, AND gate 508, inverter 502, inverter 504, and delay circuit 512. Latch circuit 510, in part, functions as a set-reset (SR) latch with a latch output that carries internal address 408. Latch circuit 510 also generates delayed internal address 421. The conditioning circuitry has the function of inhibiting the set or reset response of latch circuit 510. External address 406 and inverted delayed internal address 514 are input to AND gate 506. Inverted external address signal 406 and delayed internal address 514 are input to AND gate 508.

The delay of delay circuit 512 ("delta t") dictates a minimum pulse width output by filter 410. In one embodiment, if internal address signal 406 is in a low state and is stable such that output 421 and 408 are also low, delayed address 514 will also be low, disabling the reset leg of the circuit. The set leg is enabled in this situation in preparation for a zero to one transition. The reset leg will be disabled as long as delayed address signal 514 is low. When internal address signal 406 transitions to a high state, the reset input is disabled. Should a glitch cause a transition back to a low state immediately, the transition will not be reflected by filter 410 until the output has transitioned high and a delayed version of the output (signal 514) is transmitted to AND gates 506 and 508. Therefore, secondary transitions with a duration smaller than delta t will not be seen.

Filter 410 does not filter out all glitches, but rather guarantees that ATD signal 423 will have the minimum pulse width necessary to guarantee a valid master pulse width. A glitch on the external address may initiate a full master pulse, but between the rising edge of a master pulse in the falling edge of the master pulse (which latches the output of the memory sensing circuits) the glitch will have "passed" and the address will be valid for reading. A glitch cannot initiate a short master pulse that would cause a memory error.

Figure 8:
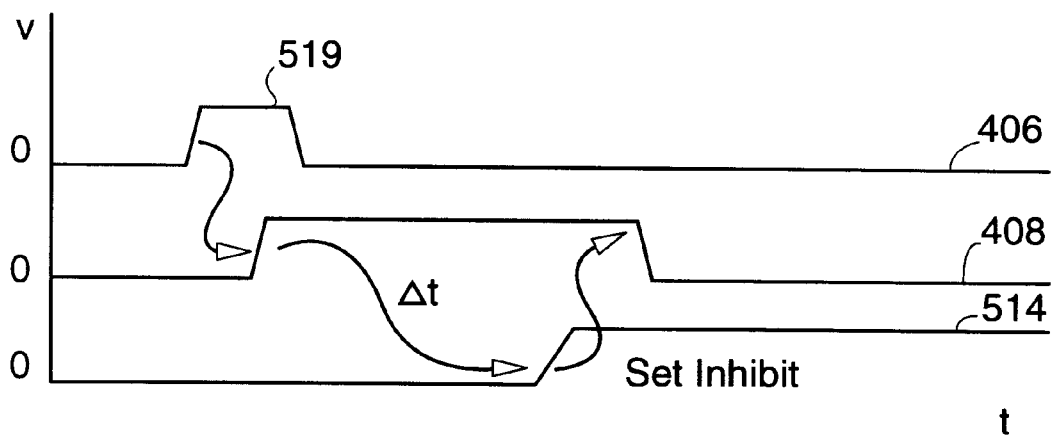
FIG. 8 is timing diagram showing behavior of signals of FIG. 7.

FIG. 8 illustrates the relationship between delta t and set or reset input transitions. FIG. 8 is a timing diagram showing the voltage of signals 406, 408 and 514 as a function of time. Internal address signal 406 exhibits glitch 519 which initiates an ATD pulse on ATD signal 408. Because of delay circuit 512, however, the latch does not reset in response to the trailing edge of ATD signal 408 until a time delta t later. Therefore, even though external address 406 has glitched, the ATD pulse on ATD signal 408 still has the required minimum width.

Figure 9:
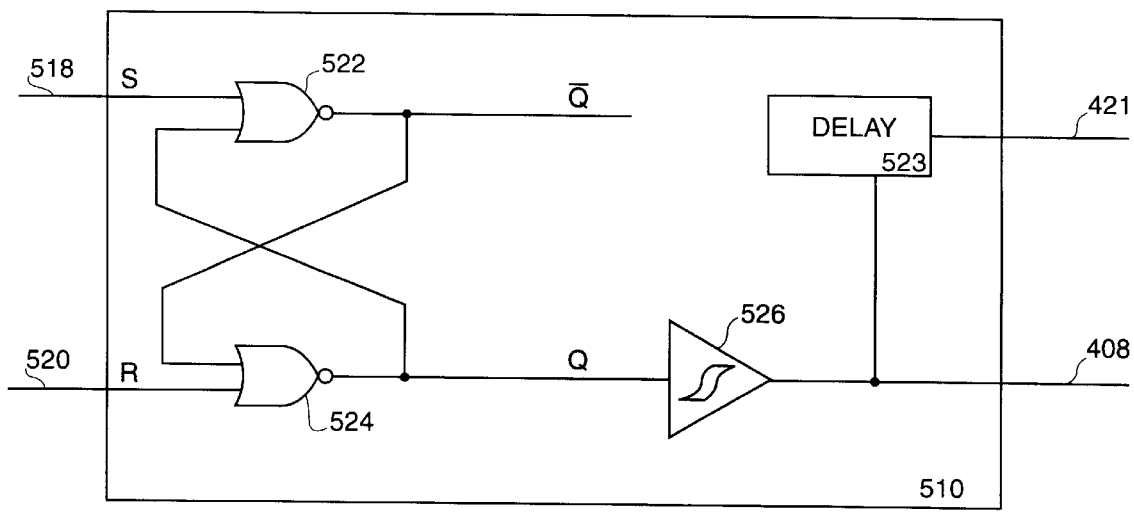
FIG. 9 is a block diagram of an embodiment of a latch circuit.

FIG. 9 is a block diagram of latch circuit 510. Set input 518 and reset input 520 enter respective cross-coupled NOR gates 522 and 524. The Q output of the latch arrangement is transmitted to trigger circuit 526. Trigger circuit 526, when activated, generates a pulse on ATD signal 408. ATD signal 408 is also input to delay circuit 523 to be output as delayed internal address 421. Trigger circuit 526 and the latch arrangement made up of NOR gates 522 and 524 are designed to work together to eliminate behavioral anomalies caused by the inherent metastability that is known to be characteristic of latches.

Figure 10:
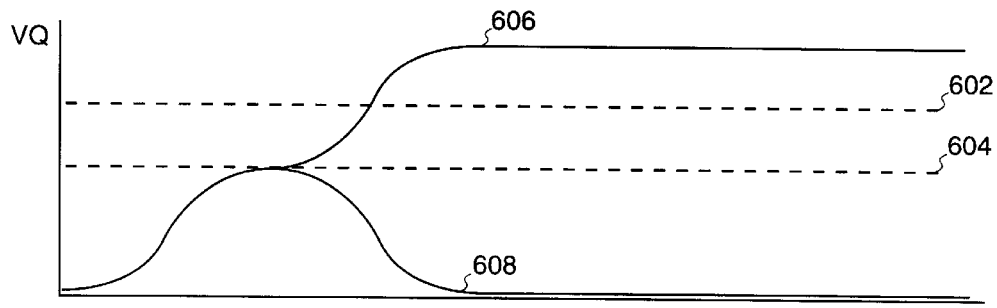
FIG. 10 is a diagram showing the behavior of latch output voltage about the latch metastable point.

FIG. 10 is a timing diagram showing the voltage on output Q as a function of time during a low to high transition. Line 604 shows the metastable point of the latch, and line 602 shows the trip point of the trigger for a low to high transition. Waveform 608 shows the voltage on Q rising to hover about the metastable point before falling to zero again. Waveform 606 shows the voltage on Q passing through the metastable point to complete a zero to one transition.

Figure 11:
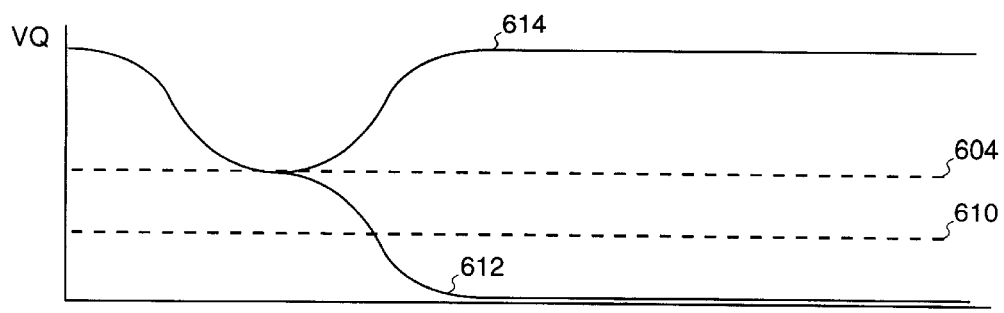
FIG. 11 is a diagram showing behavior of latch output voltage about the latch metastable point.

FIG. 11 is a timing diagram showing the voltage of output Q over time during a high to low transition. Line 604 shows the metastable point of the latch. Line 610 shows the trip point of the trigger for a one to zero transition. Waveform 614 shows the voltage on Q dropping to the metastable point and hovering about the metastable before returning to a high state. Waveform 612 shows the voltage on Q dropping to the metastable point before descending to a low state. Note that trigger circuit 526 has a higher trip point for a zero to one transition than for a one to zero transition. This is illustrated in the transfer function of FIG. 12, which is the transfer function of trigger circuit 526.

Figure 12:
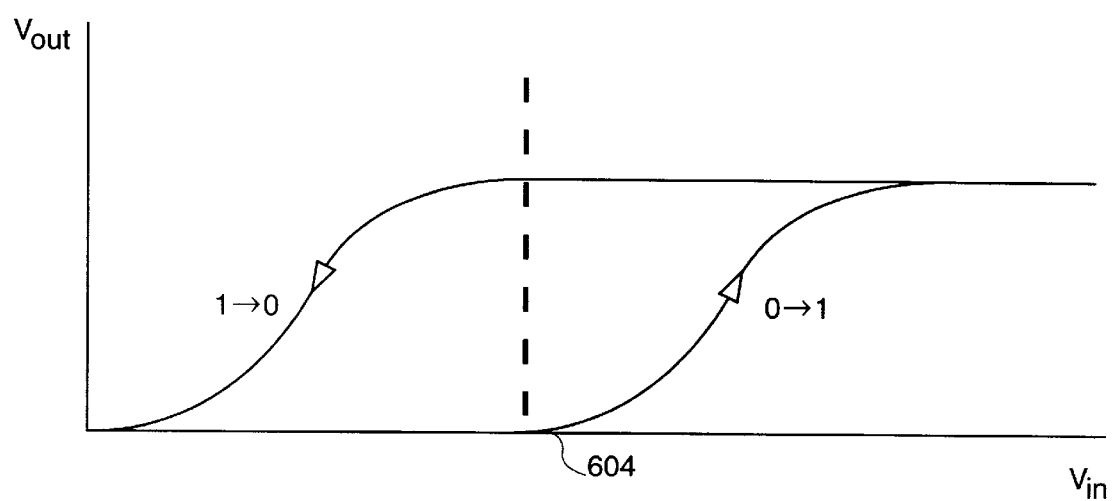
FIG. 12 is a diagram showing a transfer function of a trigger circuit.

FIG. 12 shows the voltage out of trigger circuit 526 as a function of the voltage into trigger circuit 526. A hysteresis curve about voltage 604 is shown, where voltage 604 is the metastable point of the latch of latch circuit 510. The output of trigger circuit 526 is almost ideal in that no glitch is propagated through trigger circuit 526. If output Q begins a low to high transition, the transition will always be completed to the full voltage representing the high logic state. Similarly, if a high to low transition is initiated on the input of trigger circuit 526 a complete transition will always occur to the full voltage representing the low logic state.

Figure 13:
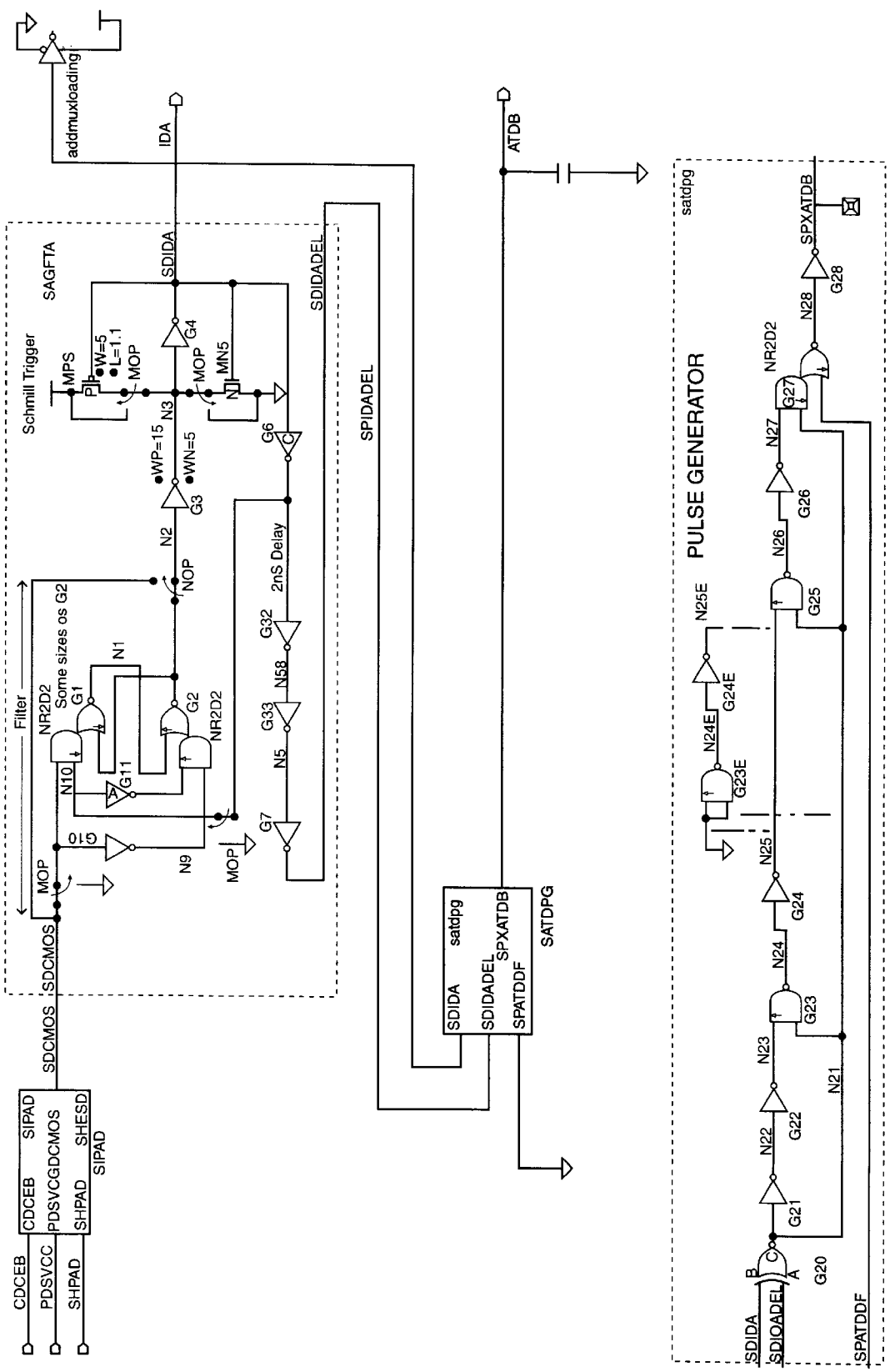
FIG. 13 is a circuit diagram of one embodiment.

FIG. 13 is a circuit diagram showing a particular implementation including a filter implementation, a trigger circuit implementation, and a pulse generator implementation.

Figure 14:
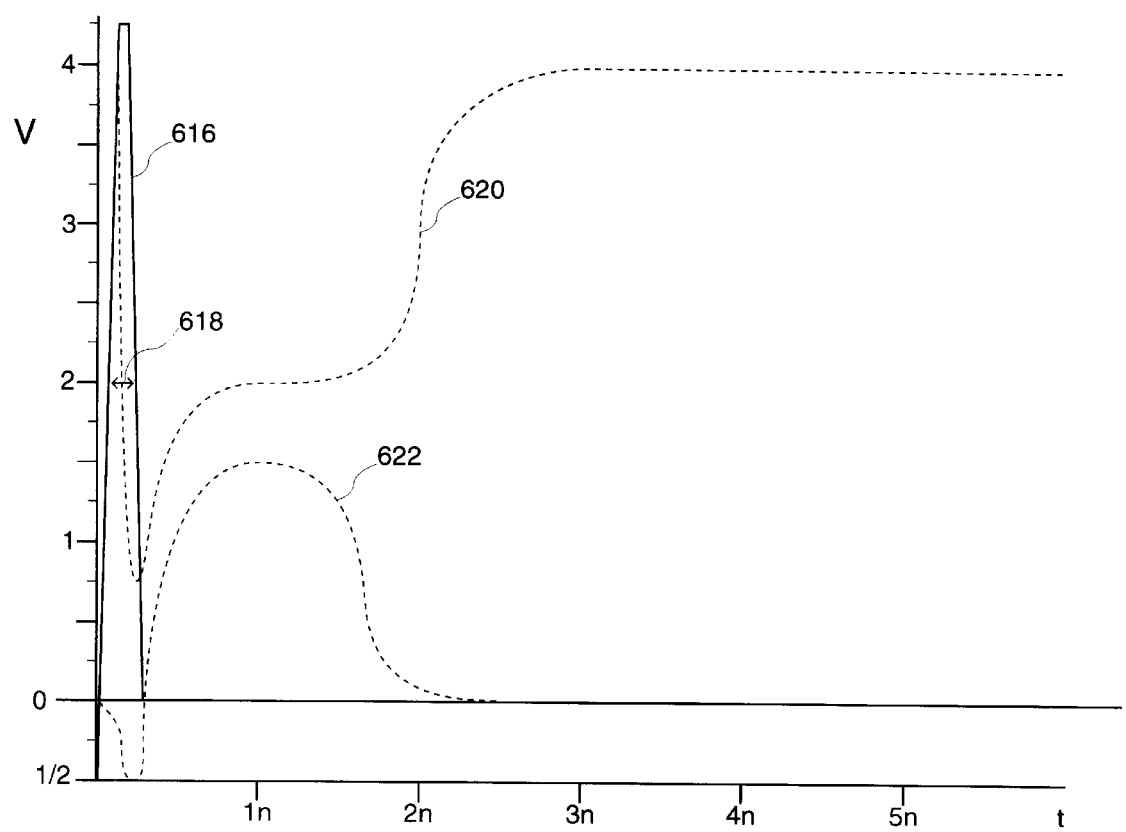
FIG. 14 is a timing diagram showing the behavior of signals of FIG. 13.

FIG. 14 is a timing diagram showing behavior of signals of ATD 308 as implemented in the circuit of FIG. 13. Signal 616 illustrates a glitch on the external address signal labeled in FIG. 13 as SDCMOS. Width 618 is the width of the glitch at two volts, which was measured to be 181.3 picoseconds. Signal 620 is the signal labeled as N1 in FIG. 13. Signal 622 is the signal labeled as N2 in FIG. 13. With pulse width 618, signals 620 and 622 respond as shown, but the internal address signal labeled IDA in FIG. 13 does not respond.

Figure 15:
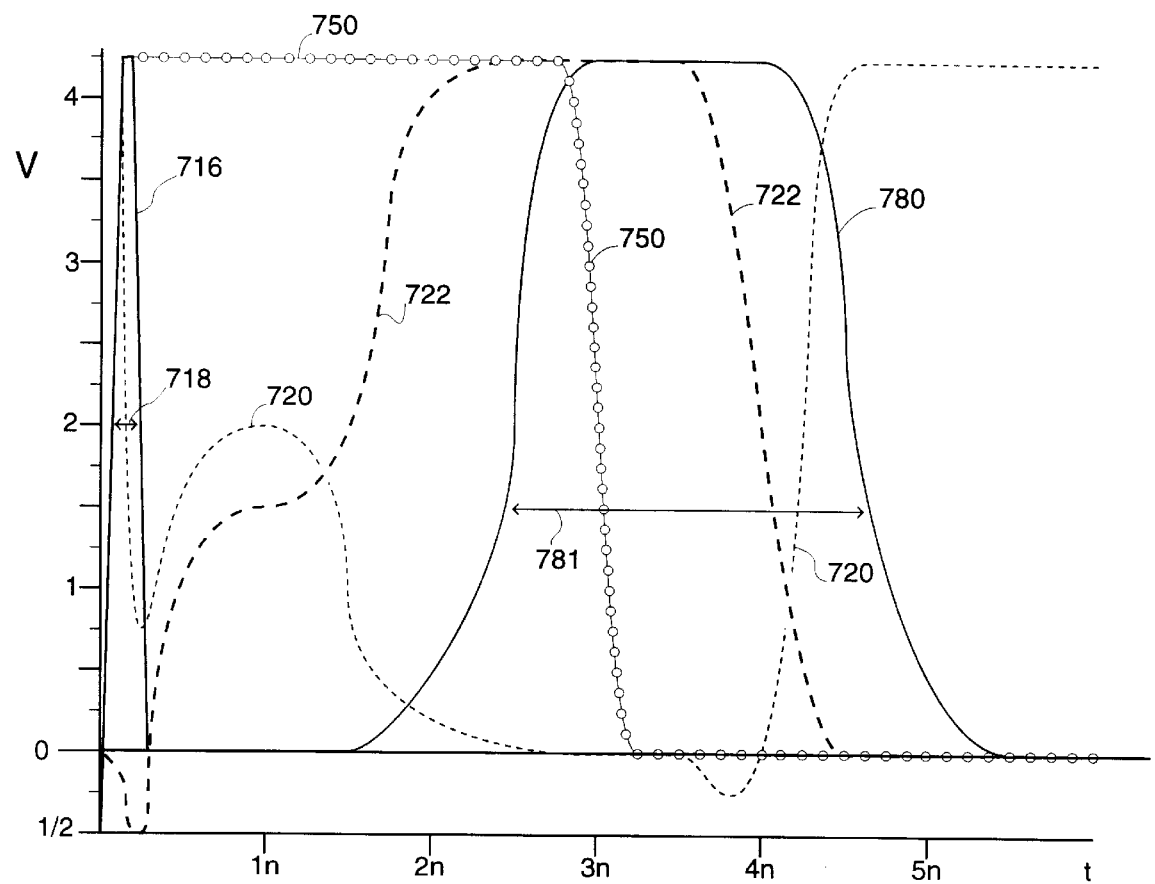
FIG. 15 is a timing diagram showing behavior of signals of the circuit of FIG. 13.

FIG. 15 is another timing diagram showing behavior of signals of ATD 308 as implemented in the circuit of FIG. 13. In FIG. 15, signal 716 corresponds to signal SDCMOS, signal 722 corresponds to signal N2, signal 720 corresponds to signal N1, signal 780 corresponds to signal IDA, and signal 750 corresponds to signal ATDB. Glitch width 718 is 181.4 picoseconds. In this case, signals 722 and 720 respond to glitch 716, and signal 780 also responds by producing a pulse of minimum internal address pulse width 781. In response, address transition detection signal (ATDB) 750 transitions from a high state to a low state as shown. FIGS. 14 and 15 demonstrate that the present invention produces an address transition detection pulse approaching an ideal step function to within an input pulse width resolution of 0.1 picoseconds.

The present invention has been described with reference to particular embodiments, however, variations may be made by one skilled in the art without departing from the spirit or scope of the invention as set forth in the following claims.

What is claimed is:

1. An apparatus for synchronizing a plurality of signals entering an electronic device, comprising:
   a filter to receive a signal of the plurality of signals entering the electronic device, wherein if a pulse width of the signal exceeds a first predetermined width, the filter outputs a pulse of a second predetermined width; and
   a pulse generator coupled to receive the pulse of the second predetermined width, and in response, to transmit a signal to elements of the electronic device to indicate a change of state of the signal.

2. The apparatus of claim 1, wherein the filter comprises:
   a latch coupled to latch a change of state of the signal, wherein the latch comprises a trigger device that receives the pulse of the first predetermined width, wherein the trigger device has a hysteresis characteristic such that a high going trigger point of the trigger device is higher than a metastable point of the latch and a low going trigger point of the trigger device is lower than the metastable point of the latch; and
   a delay circuit coupled between an input of the latch and an output of the latch, wherein the delay circuit causes an output of the latch to have a pulse width at least equal to the second predetermined width.

3. The apparatus of claim 2, further comprising:
   a first AND gate coupled to receive the signal and to receive an inverted output of the latch through the delay circuit, wherein an output of the first AND gate is coupled to a set input of the latch; and
   a second AND gate coupled to receive an inverted signal and to receive an output of the latch through the delay circuit, wherein an output of the second AND gate is coupled to a reset input of the latch.

4. In a nonvolatile memory device, an apparatus for detecting a transition in a state of an address signal entering the nonvolatile memory, comprising:
   means for generating a detection pulse of a predetermined width if an address signal transition of a minimum width is received;
   means for receiving the detection pulse and, in response, transmitting a master detection pulse of a predetermined width to elements of the nonvolatile memory device;
   means for receiving the detection pulse is coupled to receive a detection pulse for each one of a plurality of address signals entering the nonvolatile memory device;
   means for generating a detection pulse comprises a two-way latch and a trigger coupled to the two-way latch; and
   means for inhibiting comprises a delay circuit in a feedback path of the two-way latch.

5. The apparatus of claim 4, further comprising means for inhibiting operation of the latch when an address signal transition of less than the minimum width is received.

6. The apparatus of claim 4, wherein the trigger includes a hysteresis characteristic such that a high going trigger point of the trigger is higher than a metastable point of the latch and a low going trigger point of the trigger is lower than the metastable point of the latch.

7. A method for detecting a transition of an address signal entering a memory device, comprising the steps of:
   receiving an address signal entering the memory device;
   filtering pulse of the address signal to isolate address pulses of at least a minimum width;
   generating a detection signal when an address pule of at least the minimum width is isolated;
   transmitting the detection signal to a master pulse generator; and
   transmitting a master pulse to elements of the memory device.

8. The method of claim 7, further comprising the step of receiving the master pulse and, in response, preparing sensing circuits for a memory access operation.

9. The method of claim 8, further comprising the step of receiving the master pulse and, in response, charging a bit line of the memory device.

10. The method of claim 9, further comprising the step of receiving the master pulse and, in response, boosting a word line of the memory device.

11. The method of claim 10, further comprising the step of powering down a word line of the memory device based upon the master pulse.

12. In a nonvolatile memory, an address transition detection apparatus, comprising:
    a latch coupled to receive an address signal;
    a conditioning circuit coupled to the address signal and to the latch to condition inputs to the latch such that input pulses under a minimum width are rejected;
    a trigger coupled to the latch to receive an output of the latch; and
    a master pulse generator coupled to receive an output of the trigger and, in response, generate a master pulse of a predetermined width.

13. The apparatus of claim 12, wherein the conditioning circuit comprises:
    a delay circuit coupled to receive an output of the latch;
    a first AND gate coupled to receive the address signal and to receive an inverted output of the latch through the delay circuit, wherein an output of the first AND gate is coupled to a set input of the latch; and
    a second AND gate coupled to receive an inverted address signal and to receive an output of the latch through the delay circuit, wherein an output of the second AND gate is coupled to a reset input of the latch.

14. The apparatus of claim 13, wherein the trigger includes a hysteresis characteristic such that a high going trigger point of the trigger is higher than a metastable point of the latch and a low going trigger point of the trigger is lower than the metastable point of the latch.

* * * * *